(12) United States Patent
Traynor et al.

(10) Patent No.: US 9,363,610 B2
(45) Date of Patent: *Jun. 7, 2016

(54) MEMS PROCESS AND DEVICE

(71) Applicant: Wolfson Microelectronics plc, Edinburgh (GB)

(72) Inventors: Anthony Bernard Traynor, Livingston (GB); Richard Ian Laming, Edinburgh (GB); Tsjerk H. Hoekstra, Balerno (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/452,067

(22) Filed: Aug. 5, 2014

(65) Prior Publication Data

US 2014/0341402 A1 Nov. 20, 2014

Related U.S. Application Data

(63) Continuation of application No. 14/203,131, filed on Mar. 10, 2014, now Pat. No. 8,803,261, which is a continuation of application No. 13/902,344, filed on May 24, 2013, now Pat. No. 8,698,256, which is a continuation of application No. 12/673,925, filed as application No. PCT/GB2008/002772 on Aug. 15, 2008, now Pat. No. 8,546,170.

(30) Foreign Application Priority Data

Aug. 17, 2007 (GB) .................................. 0716188.8

(51) Int. Cl.
*H01L 29/84* (2006.01)
*H04R 23/00* (2006.01)
(Continued)

(52) U.S. Cl.
CPC .............. *H04R 23/00* (2013.01); *B81B 3/0021* (2013.01); *B81B 3/0072* (2013.01);
(Continued)

(58) Field of Classification Search
CPC ....................................................... H01L 21/00
USPC ........... 438/444, 53; 257/416, E21.5, E21.52, 257/E29.324, 414
See application file for complete search history.

(56) References Cited

U.S. PATENT DOCUMENTS 4,993,072 A * 2/1991 Murphy ................. H04R 19/01
307/400
5,870,482 A * 2/1999 Loeppert ............... B81B 3/0072
381/174

(Continued)

FOREIGN PATENT DOCUMENTS

DE 10008988 A1 8/2001
DE 102004050764 A1 10/2004
(Continued)

*Primary Examiner* — Telly Green
(74) *Attorney, Agent, or Firm* — Blank Rome LLP

(57) ABSTRACT

A method of fabricating a micro-electrical-mechanical system (MEMS) transducer comprises the steps of forming a membrane on a substrate, and forming a back-volume in the substrate. The step of forming a back-volume in the substrate comprises the steps of forming a first back-volume portion and a second back-volume portion, the first back-volume portion being separated from the second back-volume portion by a step in a sidewall of the back-volume. The cross-sectional area of the second back-volume portion can be made greater than the cross-sectional area of the membrane, thereby enabling the back-volume to be increased without being constrained by the cross-sectional area of the membrane. The back-volume may comprise a third back-volume portion. The third back-volume portion enables the effective diameter of the membrane to be formed more accurately.

6 Claims, 8 Drawing Sheets

(51) Int. Cl.
*B81B 3/00* (2006.01)
*H04R 19/04* (2006.01)
*H01L 27/00* (2006.01)
*H04R 19/00* (2006.01)
*H04R 31/00* (2006.01)

(52) U.S. Cl.
CPC ............ *B81B 3/0094* (2013.01); *H01L 27/00* (2013.01); *H04R 19/00* (2013.01); *H04R 19/04* (2013.01); *B81B 2201/00* (2013.01); *B81B 2201/0235* (2013.01); *B81B 2201/0257* (2013.01); *B81B 2201/0264* (2013.01); *H04R 31/00* (2013.01); *H04R 2499/11* (2013.01)

(56) References Cited

U.S. PATENT DOCUMENTS

| | | | |
|---|---|---|---|
| 6,667,189 B1 * | 12/2003 | Wang | H04R 19/005 381/191 |
| 6,933,222 B2 | 8/2005 | Dubin et al. | |
| 7,101,502 B2 | 9/2006 | Smith et al. | |
| 7,132,307 B2 * | 11/2006 | Wang | H04R 19/005 381/191 |
| 7,294,931 B2 | 11/2007 | Barns | |
| 7,449,356 B2 * | 11/2008 | Weigold | H04R 19/005 257/419 |
| 7,514,287 B2 * | 4/2009 | Huang et al. | 438/53 |
| 7,569,906 B2 * | 8/2009 | Mori | H01L 27/0629 257/416 |
| 7,648,859 B2 * | 1/2010 | Robert | B81C 1/00293 257/414 |
| 7,656,071 B2 | 2/2010 | Mehta | |
| 7,781,249 B2 * | 8/2010 | Laming | B81C 1/00158 257/E21.214 |
| 7,880,093 B2 | 2/2011 | Lee | |
| 8,169,041 B2 * | 5/2012 | Pahl | B81B 7/0064 257/416 |
| 8,432,007 B2 * | 4/2013 | Leidl | B81B 7/0064 257/416 |
| 8,803,261 B2 | 8/2014 | Traynor et al. | |
| 2004/0075366 A1 | 4/2004 | Mehta | |
| 2005/0098855 A1 | 5/2005 | Shimoji et al. | |
| 2006/0157841 A1 * | 7/2006 | Minervini | H04R 19/04 257/680 |
| 2006/0228823 A1 | 10/2006 | Xu et al. | |
| 2007/0013052 A1 | 1/2007 | Zhe et al. | |
| 2007/0077727 A1 * | 4/2007 | Huang et al. | 438/444 |
| 2007/0114643 A1 | 5/2007 | Dcamp et al. | |
| 2007/0165888 A1 | 7/2007 | Weigold | |
| 2007/0262464 A1 | 11/2007 | Watkins et al. | |
| 2008/0006093 A1 | 1/2008 | Ueya | |
| 2008/0157301 A1 | 7/2008 | Ramakrishna et al. | |
| 2008/0303126 A1 * | 12/2008 | Wang | B81B 7/0064 257/676 |
| 2009/0001553 A1 * | 1/2009 | Pahl | B81B 7/0064 257/704 |
| 2009/0090190 A1 | 4/2009 | Ueya | |

FOREIGN PATENT DOCUMENTS

| | | | | |
|---|---|---|---|---|
| DE | 102004050764 | * | 4/2006 | ............ B81B 3/00 |
| DE | WO 2007054070 A1 | * | 5/2007 | ............ B81B 7/0064 |
| EP | 1 712 515 A2 | | 10/2006 | |
| TW | 1272671 B | | 2/2007 | |
| TW | 200711510 A | | 3/2007 | |
| WO | WO-02/45463 A2 | | 6/2002 | |
| WO | WO 2007/010421 A2 | | 1/2007 | |

* cited by examiner

MEMS PROCESS AND DEVICE

This is a continuation of application Ser. No. 14/203,131, filed on Mar. 10, 2014, now U.S. Pat. No. 8,803,261, which is a continuation of application Ser. No. 13/902,344, filed on May 24, 2013, now U.S. Pat. No. 8,698,256, which is a continuation of application Ser. No. 12/673,925, filed on Jun. 15, 2010, now U.S. Pat. No. 8,546,170, which is a 371 of International Application No. PCT/GB08/02772, filed on Aug. 15, 2008, which claims priority to UK Application No. 0716188.8, filed on Aug. 17, 2007.

FIELD OF THE INVENTION

This invention relates to a MEMS process and device, and in particular to a MEMS process and device relating to a transducer, and in particular a capacitive microphone.

BACKGROUND OF THE INVENTION

Consumer electronics devices are continually getting smaller and, with advances in technology, are gaining ever-increasing performance and functionality. This is clearly evident in the technology used in consumer electronic products and especially, but not exclusively, portable products such as mobile phones, laptop computers, MP3 players and personal digital assistants (PDAs). Requirements of the mobile phone industry for example, are driving the components to become smaller with higher functionality and reduced cost. It is therefore desirable to integrate functions of electronic circuits together and combine them with transducer devices such as microphones and speakers.

One result of the above is the emergence of micro-electrical-mechanical-systems (MEMS) based transducer devices. These may be for example, capacitive transducers for detecting and/or generating pressure/sound waves or transducers for detecting acceleration. There is also a continual drive to reduce the size and cost of these devices.

Microphone devices formed using MEMS fabrication processes typically comprise a membrane with electrodes for read-out/drive deposited on the membrane and a substrate. In the case of MEMS pressure sensors and microphones, the read out is usually accomplished by measuring the capacitance between the electrodes. In the case of transducers, the device is driven by a potential difference provided across the electrodes.

FIG. 1a shows a basic MEMS device 1 comprising a substrate 3 having a membrane 5 formed thereon. The substrate 3 comprises a back-volume 7. The back-volume 7 is formed using an etching process from below the substrate, known as a "back-etch". The back-volume 7 forms an important part of a MEMS device, since the back-volume enables the membrane to move freely in response to incident sound or pressure waves.

The substrate has a width "X" and a height "Y". For example, the width X may be typically 1.5 mm, and the depth Y typically 625 μm. The diameter of the membrane 5 is typically 1 mm.

Although not shown in FIG. 1a, it will be appreciated that, in order to incorporate the transducers into useful devices, it is necessary to interface or couple them to electronic circuitry (not shown), which may either be located on the same substrate or a separate integrated circuit.

FIG. 1b shows a view of the MEMS device 1 from underneath the substrate 3, having a back-volume 7 etched therein. The back-volume has a diameter of typically 900 μm.

There is a continual drive to reduce the overall size of a MEMS device 1, particularly when such devices are to be incorporated into portable electronic equipment. However, as will be appreciated, reducing the size, and in particular the height, of the MEMS device has the consequential effect of reducing the size and hence volume of the back-volume 7. That is, an obvious method of reducing the height of the device is to reduce the thickness of the substrate 3, and this will cause the back-volume 7 to reduce in size also. Reducing the size of the back-volume 7 can have a degrading effect on the output signals produced by the MEMS device 1. It will therefore be appreciated that a trade-off exists between the size and performance of the MEMS device.

This is because the back-volume 7 must be of sufficient size to produce sufficient compliance, i.e. compression, to allow a substantially un-damped movement, i.e. deflection, of the membrane. In a microphone having a small back-volume the compliance is reduced and therefore the sensitivity is reduced. Pressure relief holes (not shown) are required between the back-volume 7 and the atmosphere to prevent pre-stressing of the membrane. These pressure relief holes introduce an acoustic impedance between the back-volume and the atmosphere which, in relationship with the compliance of the back-volume, introduce a 1/f noise spectrum into the microphone output.

Increasing the back-volume increases the signal-to-noise ratio (SNR) of the microphone. The larger the back-volume becomes, the greater the compliance, i.e. the less the impedance, of the back-volume becomes. As a consequence, the lower in frequency the 1/f noise spectrum, due to the pressure relief holes, becomes.

One way of overcoming the drawback of reducing the back-volume when reducing the height of the MEMS device is to increase the diameter or area of the back-volume 7, such that a reduction in height is offset by the increased diameter or area. However, the amount by which the diameter or area of the back-volume 7 can be increased is limited by the diameter of the membrane. For example, with the dimensions given as examples in FIGS. 1a and 1b, the area of the back-volume 7 cannot be increased significantly above 900 μm, since the diameter of the membrane is only 1 mm.

It is therefore an aim of the present invention to provide a MEMS device that is capable of increasing the back-volume for any given height.

SUMMARY OF THE INVENTION

According to a first aspect of the invention, there is provided a method of fabricating a micro-electrical-mechanical system (MEMS) transducer on a substrate. The method comprises the steps of forming a membrane on a substrate, and forming a back-volume in the substrate. The step of forming a back-volume in the substrate comprises the steps of forming a first back-volume portion and a second back-volume portion, the back-volume having a step in a sidewall of the back-volume, that separates the first back-volume portion from the second back-volume portion.

The provision of a back-volume having first and second back-volume portions, one portion having a cross-sectional area that is larger than the other, enables the overall height of the MEMS device to be reduced, while allowing the effective size of the back-volume to be maintained or increased.

According to another aspect of the invention, there is provided a micro-electrical-mechanical system (MEMS) transducer comprising a substrate, a back-volume formed in the substrate, and a membrane formed over the back-volume and on the substrate. The back-volume comprises a first back-volume portion and a second back-volume portion, the first back-volume portion being separated from the second back-volume portion by a step in a sidewall of the back-volume.

BRIEF DESCRIPTION OF THE DRAWINGS

For a better understanding of the invention, and to show more clearly how it may be carried into effect, reference will now be made, by way of example only, to the accompanying drawings in which.

DETAILED DESCRIPTION

The embodiments below are described in relation to a basic MEMS device having a substrate and a membrane. It will be appreciated, however, that the invention is equally applicable to other MEMS devices having different structures, for example a different number of layers.

Figure 1A:
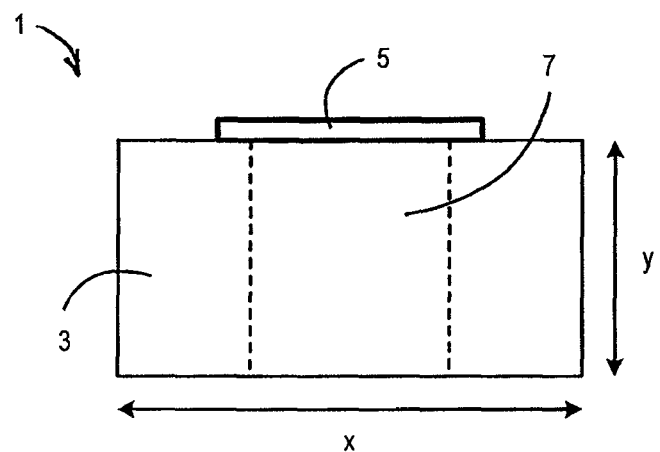
FIG. 1a is a schematic view of a MEMS device.
Figure 1B:
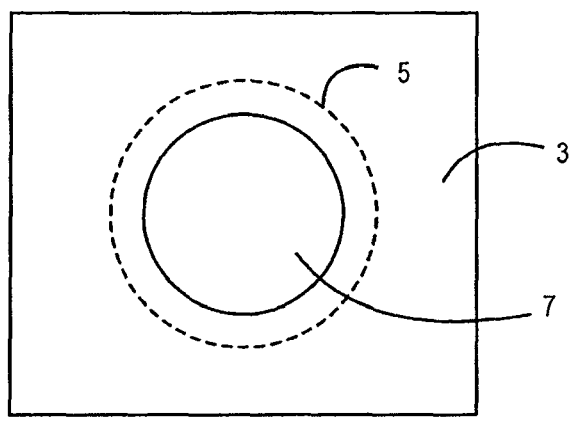
FIG. 1b is a schematic view of the MEMS device of FIG. 1a from underneath.
Figure 2A:
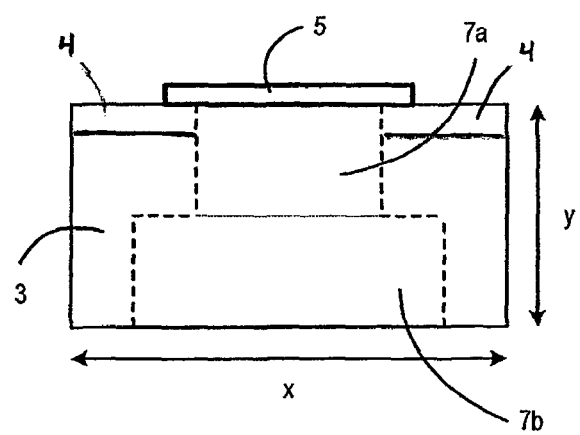
FIG. 2a is a schematic view of a MEMS device according to a first embodiment of the present invention.

FIG. 2a shows a MEMS transducer 1 according to a first embodiment of the invention. The MEMS transducer 1 comprises a substrate 3 with a membrane 5 formed thereon. The MEMS device 1 has a back-volume formed from a first back-volume portion 7a and a second back-volume portion 7b. The back-volume is formed in the substrate 3 such that the back-volume lies at least partially under an area 4 of the substrate 3 containing electronic circuitry. The first back-volume portion 7a has a first cross-sectional area or diameter, while the second back-volume portion has a second cross-sectional area or diameter 7b. The provision of the first back-volume portion 7a and the second back-volume portion 7b has the advantage of enabling the effective volume of the back-volume to be retained, even when reducing the overall height of the transducer. The first and second back-volume portions 7a, 7b also enable the overall volume of the back-volume (7a, 7b) to be increased, if desired, without being constrained by the diameter of the membrane 5.

The cross-sectional area of the first back-volume portion 7a is different to the cross sectional area of the second back-volume portion 7b in a plane where the first back-volume portion 7a and the second back-volume portion 7b meet.

The cross-sectional area of the second back-volume portion 7b is made greater than the cross-sectional area of the first back-volume portion 7a. The cross-sectional area of the second back-volume portion 7b can also be made greater than the cross-sectional area of the membrane 5.

That is, the back-volume 7 comprises a step between the first back-volume portion 7a and the second back-volume portion 7b, in which there is a discontinuity in the cross-sectional area of the back-volume going from the first portion 7a to the second portion 7b.

In this manner the overall volume of the back-volume of the MEMS transducer can be increased using the second back-volume portion 7b, i.e. by increasing its cross-sectional area (for example its diameter in the case of a back-volume having a circular cross-section).

The height of the substrate can be reduced, for example, from 625 μm to 400-500 μm and the effective volume of the back-volume retained or increased by enlarging the cross-sectional area of the second back-volume portion 7b.

It is noted that the size of the second back-volume portion 7b may also be constrained by the area on the underside of the substrate 3 that is not etched away. That is, in operation the MEMS transducer 1 is attached to a package via some adhesive means (for example, glue, glass frit, epoxy, etc) applied on the underside of the substrate 3. Therefore there needs to be sufficient surface area that a secure connection can be made between the underside of the substrate 3 and the package.

Figure 2B:
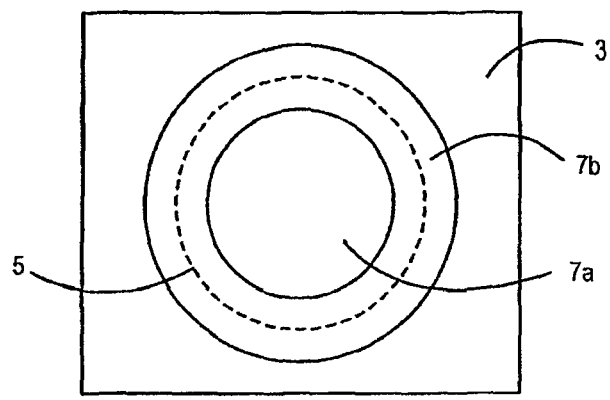
FIG. 2b is a schematic view of the MEMS device of FIG. 2a from underneath.

FIG. 2b shows the MEMS transducer of FIG. 2a from underneath, illustrating the first back-volume portion 7a and the second back-volume portion 7b.

Figure 2C:
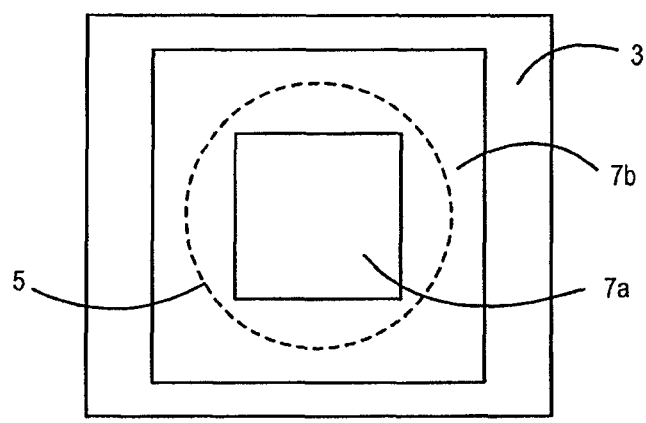
FIG. 2c is a schematic view of a MEMS device according to another aspect of the present invention.
Figure 3A:
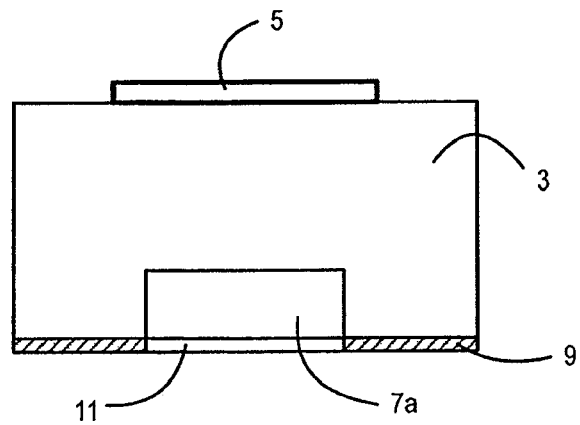
FIGS. 3a to 3c are cross-sectional views illustrating a process for forming the MEMS device shown in FIGS. 2a and 2b.
Figure 3B:
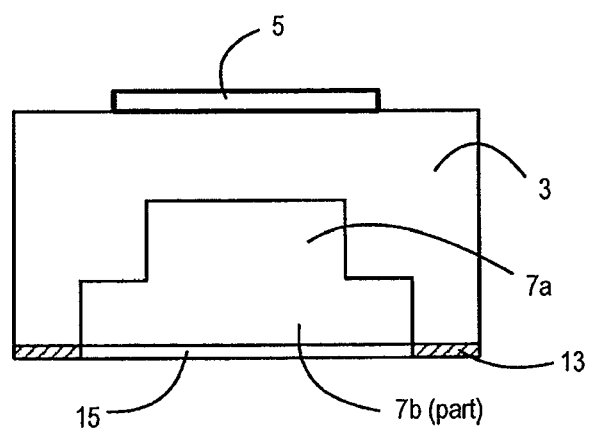
Figure 3C:
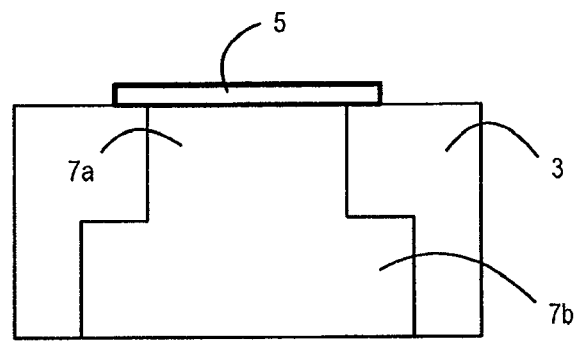

It will be appreciated that the back-volume may be formed using openings having other shapes and configurations, other than the circular opening shown in the embodiment of FIGS. 2a and 2b, such shapes and configurations being dependent upon factors such as the type of etching (wet or dry), the characteristics of the etchant (isotropic or anisotropic), the masking employed, and so forth. For example, a square opening may be used as shown in FIG. 2c, as this provides the greatest cross-sectional area possible when the substrate 3 is also square. In a similar manner a rectangular opening may be used, for example when the substrate is rectangular. It is also noted that the membrane could be square or rectangular, rather than circular as shown in the embodiments. FIGS. 3a, 3b and 3c are cross-sectional views illustrating the process steps for fabricating the MEMS transducer of FIGS. 2a and 2b according to a first method. FIG. 3a shows a MEMS device having a substrate 3 and a membrane 5 formed thereon. A mask layer 9 is applied to the underside of the substrate 3, the mask layer 9 having an opening 11. The cross-sectional area or diameter of the opening 11 corresponds to the cross-sectional area or diameter of the desired first back-volume portion 7a. After the application of the first mask layer 9 the substrate is etched to a predetermined depth. For example, the substrate may be etched to a depth of 150 μm. The depth of the first etch determines the respective heights of the first and second back-volume portions. As such, the depth of the first etch can be used to control the overall size of the back-volume.

The substrate is then masked with a mask layer 13 having a second opening 15, as shown in FIG. 3b. The cross-sectional area or diameter of the second opening 15 corresponds to the cross-sectional area or opening of the desired second back-volume portion 7b.

The substrate is then etched to create the second back-volume portion 7b. It is noted that during the etching of the larger second back-volume portion 7b, the first back-volume portion 7a will continue to etch through the substrate 3, until the first back-volume portion 7a exposes the membrane 5, as shown in FIG. 3c.

It is noted that the first mask layer 9 may be removed prior to forming the second mask layer 13. Alternatively, rather than applying a second mask layer 13, the first mask layer may be etched to create a mask layer having the larger opening for the second etch process. As a further alternative, the first mask layer 9 may be left in place, and etched through the larger opening 15 of the second mask layer 13 during the second etch process. It will be appreciated that the first option may be preferable when desiring to make the overall height of the MEMS device as low as possible.

It is also noted that the second mask layer 13 may be removed after the second etch process has been completed, again in an attempt to reduce the overall height of the MEMS device.

According to an alternative embodiment, the process of forming the first and second back-volume portions can be achieved using a first mask layer, for example an SiO2 layer, and a second layer in the form of a photo resist layer. According to such an embodiment, the SiO2 layer is placed in direct contact with the substrate 3 and patterned with the larger cross-sectional area corresponding to the second back-volume portion 7b. The photo resist layer is a further layer, which is patterned with a smaller cross-sectional area corresponding to the first back-volume portion 7a. The photo resist layer can be selected such that the type of photo resist and the thickness are such that the photo resist is removed when the hole corresponding to the smaller first back-volume portion 7a reaches a target depth. Thus, according to this method, the larger cross-sectional area corresponding to the second back-volume portion only becomes effective when the smaller cross-sectional area reaches its target depth, at which point the photo resist layer has been removed.

The invention described above has the advantage of providing flexibility in the shape and size of the back-volume. The invention also has the advantage of enabling the back-volume to be increased whilst facilitating reduced die size and thickness.

Figure 4:
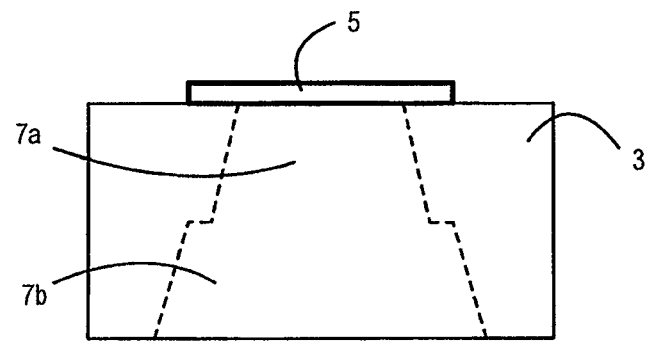
FIG. 4 is a schematic view of a MEMS device according to a second embodiment of the present invention.

Although the embodiment described in FIGS. 2a, 2b, 2c and 3a-3c is shown as having substantially "vertical" walls, it will be appreciated that the invention is equally applicable to fabrication processes that result in back-volumes being etched with converging walls, as shown in FIG. 4. For example, in FIGS. 2a and 2b the back-volume portions may be formed using dry etch processes which result in substantially vertical walls, while in FIG. 4 the back-volume portions may be formed using wet etch processes which result in sloped or curved walls.

Again, the back-volume 7 comprises a step between the first back-volume portion 7a and the second back-volume portion 7b, in which there is a discontinuity in the cross-sectional area of the back-volume going from the first portion 7a to the second portion 7b.

Alternatively, certain etching processes, for example certain ICP etching processes, create walls that slope outwards as the etch goes deeper into the substrate. That is, these processes result in back-volumes being etched with diverging walls. Of course, in order to achieve the necessary total back-volume such that vibrations in the membrane will not be dampened, the second back-volume portion 7b needs to be substantially wider than the first back-volume portion 7a in a plane where the two portions meet.

According to further embodiments of the present invention, the first and second back-volume portions 7a, 7b may be formed using a combination of dry and wet etching processes.

Figure 5:
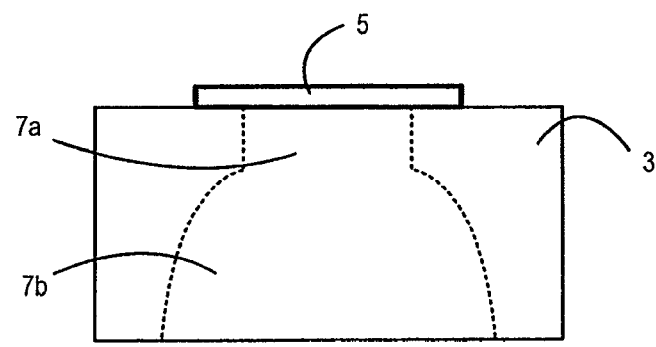
FIG. 5 is a schematic view of a MEMS device according to a third embodiment of the present invention.

For example, FIG. 5 shows a MEMS device in which the first back-volume portion 7a is formed using a dry etch process, hence having substantially vertical walls, while the second back-volume portion 7b is formed using a wet etch process, hence having sloping walls. The wet etch may result in the vertical walls of the initial dry etch becoming deformed (i.e. sloped), but a step will still be created if the first dry etch is sufficiently deep. As an alternative, the first back-volume portion 7a may be etched from above (i.e. through the back-plate using a dry etch) and then a wet etch performed from beneath.

Again, in FIG. 5 the back-volume 7 comprises a step between the first back-volume portion 7a and the second back-volume portion 7b. However, in this embodiment there is a discontinuity in a rate of change of cross-sectional area of the back-volume going from the first portion 7a to the second portion 7b. That is, although there is no discontinuity in the cross-sectional area itself, there is a discontinuity in the gradient of the sidewalls of the back-volume 7.

Figure 6:
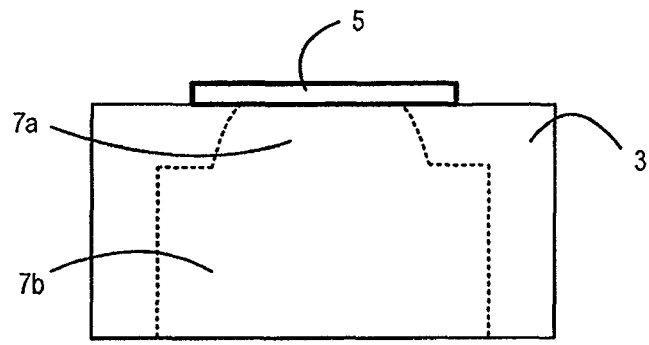
FIG. 6 is a schematic view of a MEMS device according to a fourth embodiment of the present invention.

FIG. 6 shows a MEMS device in which the first back-volume portion 7a is formed using a wet etch process, hence having sloping walls, while the second back-volume portion 7b is formed using a dry etch process, hence having substantially vertical walls.

Similarly to the embodiment discussed with respect to FIG. 5, the back-volume 7 comprises a step between the first back-volume portion 7a and the second back-volume portion 7b, with a discontinuity in a rate of change of cross-sectional area of the back-volume going from the first portion 7a to the second portion 7b.

It will be appreciated that other configurations of the back-volumes 7a, 7b are covered by the present invention, including an embodiment in which the etching processes result in a step comprising a change in the gradient of the sidewall, for example a "kink", or two or more changes in the gradient of the sidewall.

Figure 7:
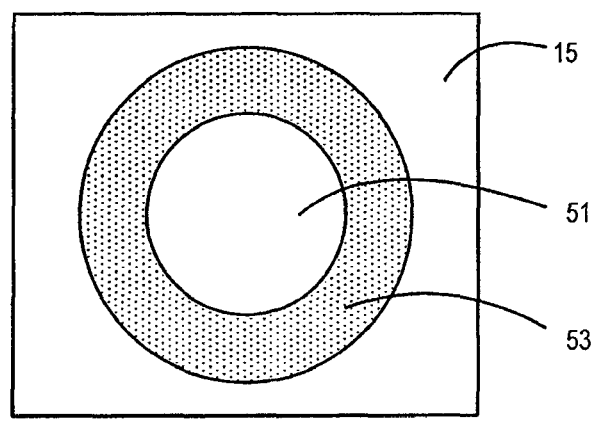
FIG. 7 illustrates an alternative process for forming the MEMS device of FIGS. 2a, 2b, 4, 5 and 6.

FIG. 7 shows an alternative method for forming the MEMS devices shown in FIGS. 2a, 2b and 4. The method comprises the use of a so-called "grey scale", whereby the mask layer has a first mask region 51 and a second mask region 53. The first mask region 51 enables the substrate to be etched at a first rate, while the second mask region 53 enables the substrate to be etched at a second rate. In this way the first mask region can be used to etch the area of the substrate corresponding to the first back-volume portion, while the second mask region 53 can be used to etch the area corresponding to the second back-volume portion.

The first mask region 51 is effectively an opening that allows the substrate to be etched unhampered. In contrast, the second mask region 53 comprises a plurality of small apertures, thereby resulting in the substrate being etched more slowly in this region dependent upon the size of the apertures and/or number of apertures. The greater the size and/or number of apertures the greater the etch rate and vice-versa.

Although the embodiments described above are shown as having first and second back-volume portions, it will be appreciated that the invention will also be applicable to back-volumes having three or more portions. For example, a greater number of portions would enable the designer of the transducer greater control over the shape and characteristics of the back-volume.

It will be appreciated that the respective volumes of the first and second back-volume portions may be chosen according to the die size of the substrate being used for the MEMS device. Also, different combinations of volumes in the first and second back-volume portions may be used to obtain the same overall volume in the back-volume.

Figure 8:
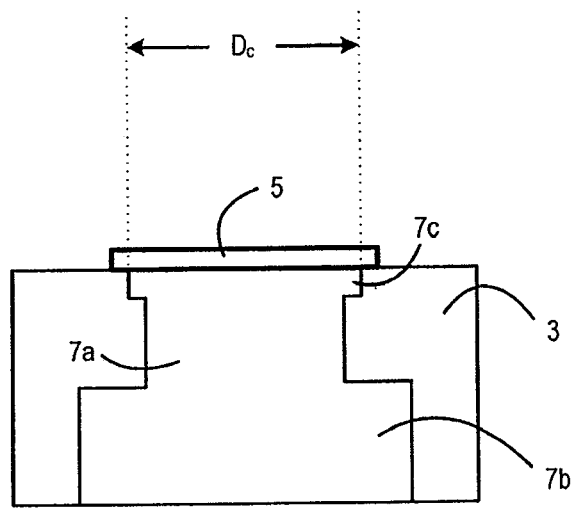
FIG. 8 shows a MEMS device according to another aspect of the present invention.
Figure 9:
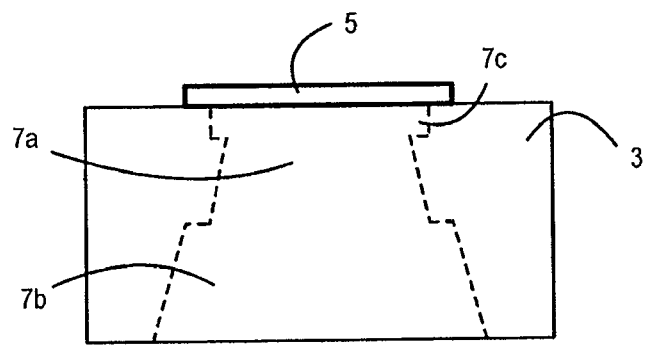
FIG. 9 shows a MEMS device according to another aspect of the present invention.

FIGS. 8 and 9 show a MEMS transducer according to a further aspect of the invention.

The transducer of FIG. 8 is similar to that of FIG. 2a or 3c, in so far as it comprises a substrate 3 with a membrane 5 formed thereon. The MEMS device 1 has a back-volume formed from a first back-volume portion 7a and a second back-volume portion 7b. The first back-volume portion 7a has a first cross-sectional area or diameter, while the second back-volume portion 7b has a second cross-sectional area or diameter. According to this aspect of the invention, the back-volume further comprises a third back-volume portion 7c.

The third back-volume portion 7c has a third cross-sectional area or diameter $D_c$, the third cross-sectional area or diameter $D_c$ being different to the first cross-sectional area or diameter of the first back-volume portion 7a. In the embodiment shown in FIG. 8, the diameter $D_c$ is larger than the diameter of the first back-volume portion 7a, but smaller than the diameter of the membrane 5.

As with the previously described embodiments, the provision of the first back-volume portion 7a and the second back-volume portion 7b has the advantage of enabling the effective volume of the back-volume to be retained, even when reducing the overall height of the transducer. The first and second back-volume portions 7a, 7b also enable the overall volume of the back-volume (7a, 7b) to be increased, if desired, without being constrained by the diameter of the membrane 5.

In addition, according to this embodiment of the invention, the provision of a third back-volume portion 7c has the added advantage of enabling the first and second back-volume portions 7a, 7b to be etched (for example from the underside of the substrate), such that the diameter of the first back-volume portion 7a does not define the effective diameter of the flexible membrane 5. In other words, with the embodiments of FIGS. 2a and 3c, the etching of the first back-volume portion defines the effective diameter of the membrane 5 (i.e. the "effective diameter" of the membrane being the part of the membrane that is not connected to, or supported by the substrate 3, and hence free to move). However, due to the fact that the etching process through the substrate 3 can be difficult to control in a precise manner, this can result in the diameter of a membrane 5 from one device being different to the diameter of a membrane on a different device.

The provision of a third back-volume portion 7c means that the diameter $D_c$ of the third back-volume portion defines the effective diameter of the membrane 5. According to one embodiment, the third back-volume portion 7c may be formed by removing a portion of sacrificial material which has previously been formed in the area corresponding to where the third back-volume portion 7c is to be formed. For example, referring to FIG. 3A, a portion of sacrificial material (not shown) corresponding to the third back-volume portion may be formed in the upper part of the substrate 3 prior to the membrane 5 being deposited. It will be appreciated that there are a number of ways in which the portion of sacrificial material can be formed, as will be well known to a person skilled in the art. With this embodiment, the first and second back-volume portions 7a, 7b can be formed as described above in relation to FIGS. 3A to 3C. However, as the first back-volume portion 7a is etched away, the portion of sacrificial material in the area corresponding to the third back-volume portion can act as an etch-stop. For example, if the sacrificial material is made from a different material to the substrate 3, a different etching process can then be used to remove the portion of sacrificial material, thereby creating the third back-volume portion 7c. Thus, the etching process for forming the third back-volume portion may be different to the etching process used to form the first and/or second back-volume portions.

Although the embodiment above has been described in relation to the MEMS transducer shown in FIGS. 2A and 3C, it is noted that the provision of a third back-volume portion can also be used with any of the other embodiments described above. For example, FIG. 9 shows the embodiment of FIG. 4 having a third back-volume portion.

Although the embodiments of FIGS. 8 and 9 have been described as using a portion of sacrificial material for forming the third back-volume portion 7c, it will be appreciated that the third back-volume portion 7c may be formed in other ways, for example without using a portion of sacrificial material, as will be familiar to a person skilled in the art.

Furthermore, it is noted that the etching steps may be performed in a different manner or order. For example, the removal of the portion of sacrificial material used to form the third back-volume 7c may be carried out by etching from above the substrate 3, for example if the membrane 5 has one or more holes (not shown) provided therein. It is noted that the etching steps may also be performed in a different order to those described above.

It is also noted that the use of the term "diameter" is not intended to provide any limitation concerning a "circular" nature. Instead, the term diameter is intended to denote the width, or distance across a particular section of back-volume, substrate or membrane.

A person skilled in the art will appreciate that the embodiments described above are not limited to the fabrication of MEMS transducers in the form of microphones. For example, the invention is also applicable to other MEMS transducers, such as accelerometers having a mass located on the membrane.

Figure 10:
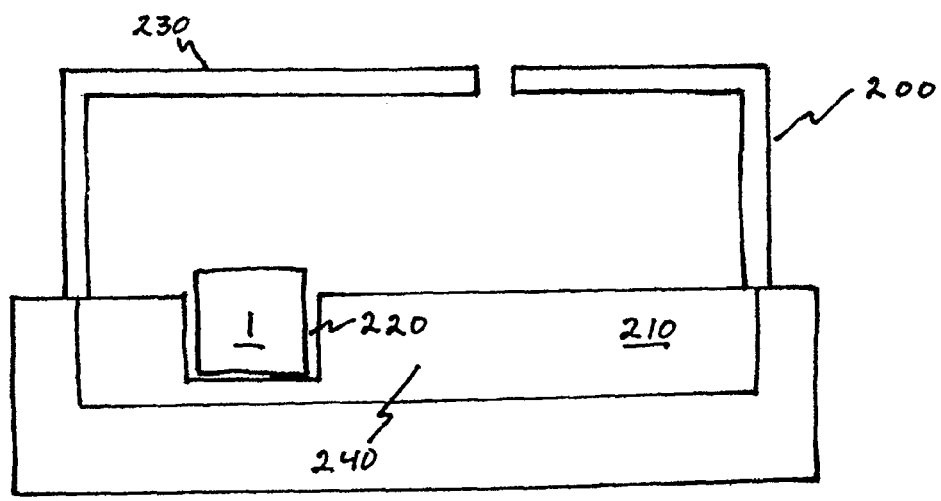
FIG. 10 shows a MEMS device in an electronic package, according to an aspect of the invention.

Furthermore, it is noted that the present invention embraces an electronic package 200 comprising a MEMS transducer 1 as described above and as illustrated in FIG. 10. In addition, the electronic package 200 may comprise a substrate 210 having a recess 220 as defined in co-pending UK patent application GB 2,451,908 A, wherein the MEMS transducer 1 is situated in said recess 220. The package 200 may also comprise a lid 230, wherein the package 200 forms an RF cage 240.

Although the embodiments have been described in relation to the membrane moving in response to pressure differences, and in particular pressure differences caused by sound waves, the membrane may also be configured to move in response to absolute pressure.

Figure 11:
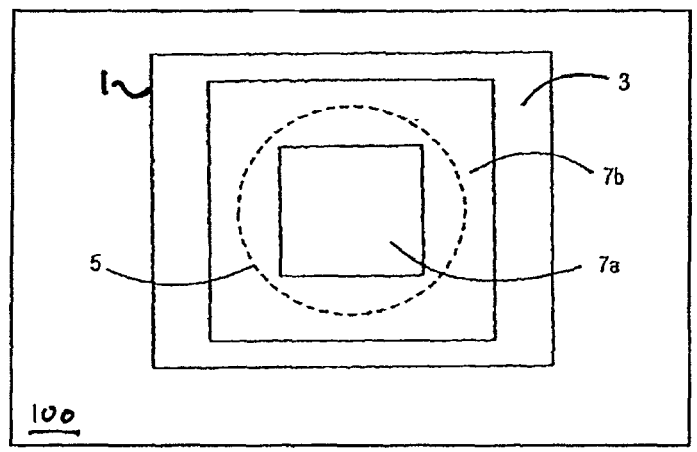
FIG. 11 shows a MEMS device within an additional system or application, according to an aspect of the invention.

It is noted that the invention may be used in a number of applications 100, as illustrated in FIG. 11. These applications 100 include, but are not limited to, consumer applications, medical applications, industrial applications and automotive applications. For example, typical consumer applications include laptops, mobile phones, PDAs and personal computers. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil

What is claimed is:

1. A micro-electrical-mechanical system (MEMS) capacitive microphone comprising:
   a semiconductor substrate comprising electronic circuitry;
   a membrane formed relative to a first side of the semiconductor substrate; and
   a back-volume formed in the semiconductor substrate relative to a second side of the semiconductor substrate; and
   wherein the back-volume is formed in the semiconductor substrate such that the back-volume lies at least partially under an area of the semiconductor substrate comprising electronic circuitry.

2. A MEMS capacitive microphone as claimed in claim 1, wherein the back-volume is formed such that the back-volume extends through the semiconductor substrate, between the membrane and the second side to form an opening, and also extends into the semiconductor substrate.

3. A MEMS capacitive microphone as claimed in claim 2, wherein the back-volume extends into the semiconductor substrate in a direction substantially orthogonal to an axis of the opening.

4. A MEMS capacitive microphone as claimed in claim 1, wherein the back-volume comprises:
   a first back-volume portion and a second back-volume portion having a boundary therebetween defined by a discontinuity in a sidewall of the substrate; and
   wherein the cross sectional area of the second back-volume portion is greater than the cross sectional area of the first back-volume portion.

5. A micro-electrical-mechanical system (MEMS) capacitive microphone comprising:
   a substrate;
   a membrane formed relative to a first side of the substrate; and
   a back-volume formed in the substrate relative to a second side of the substrate;
   wherein the back-volume comprises at least a first back-volume portion, a second back-volume portion and a third back-volume portion, each having a boundary therebetween defined by a discontinuity in a sidewall of the substrate.

6. A MEMS capacitive microphone as claimed in claim 5, wherein the cross sectional area of the second back-volume portion is greater than the cross sectional area of the first back-volume portion.

* * * * *